United States Patent
Matsumura

(10) Patent No.: US 8,164,106 B2
(45) Date of Patent: Apr. 24, 2012

(54) AlGaInP LIGHT EMITTING DIODE

(75) Inventor: Atsushi Matsumura, Chichibu (JP)

(73) Assignee: Showa Denko K.K., Tokyo (JP)

( * ) Notice: Subject to any disclaimer, the term of this patent is extended or adjusted under 35 U.S.C. 154(b) by 82 days.

(21) Appl. No.: 12/525,789

(22) PCT Filed: Feb. 4, 2008

(86) PCT No.: PCT/JP2008/051751
§ 371 (c)(1),
(2), (4) Date: Aug. 4, 2009

(87) PCT Pub. No.: WO2008/099699
PCT Pub. Date: Aug. 21, 2008

(65) Prior Publication Data
US 2010/0006818 A1    Jan. 14, 2010

(30) Foreign Application Priority Data
Feb. 5, 2007   (JP) .................. 2007-025054

(51) Int. Cl.
*H01L 33/00* (2010.01)
(52) U.S. Cl. .................. 257/96; 257/E31.105
(58) Field of Classification Search ............. 257/96, 257/103, E31.105, E25.032
See application file for complete search history.

(56) References Cited

U.S. PATENT DOCUMENTS

| 5,153,889 A | 10/1992 | Sugawara et al. |
| 5,410,159 A | 4/1995 | Sugawara et al. |
| 6,265,732 B1 * | 7/2001 | Nakatsu et al. .......... 257/86 |
| 2003/0219918 A1 | 11/2003 | Shinohara et al. |
| 2005/0116309 A1 | 6/2005 | Ohyama et al. |

FOREIGN PATENT DOCUMENTS

| JP | 3732626 B2 | 3/1993 |
| JP | 3373561 B2 | 4/1994 |
| JP | 2002-237617 A | 8/2002 |
| JP | 2004-047973 A | 2/2004 |
| JP | 2005-159297 A | 6/2005 |
| JP | 2006-253180 A | 9/2006 |
| JP | 2007-019124 A | 1/2007 |
| JP | 2007-19262 A | 1/2007 |
| WO | 2007004741 A1 | 1/2007 |

* cited by examiner

*Primary Examiner* — Thomas L Dickey
(74) *Attorney, Agent, or Firm* — Sughrue Mion, PLLC

(57) ABSTRACT

A light emitting diode which includes a laminate including an n-type cladding layer, an emission layer which has a quantum well structure having a well layer and a barrier layer, an intermediate layer and a p-type cladding layer in this order, wherein the composition of each of the layers is represented by the composition formula: $(Al_XGa_{1-X})_YIn_{1-Y}P$ ($0 \leq X \leq 1$, $0 < Y \leq 1$), and the composition of the barrier layer is represented by the composition formula: $(Al_XGa_{1-X})_YIn_{1-Y}P$ ($0.5 \leq X \leq 1$, $0 < Y \leq 1$).

20 Claims, 6 Drawing Sheets

AlGaInP LIGHT EMITTING DIODE

TECHNICAL FIELD

The present invention relates to a high-luminous light-emitting diode (LED), and particularly relates a LED wherein deterioration in the case of extended drive is improved.

BACKGROUND ART

An AlGaInP based compound semiconductor light emitting diode can emit light with high efficiency in the wavelength region from red to yellow-green, and therefore, the use of the diode is expanded to the fields for a vehicle, traffic light and the like. Furthermore, the diode is used in combination with a GaN base compound semiconductor light emitting diode to prepare a white light emitting diode which can emit white light by emitting the three primary colors of blue, green and red.

The object of the AlGaInP based compound semiconductor light emitting diode is to improve the decrease in luminous efficiency and the deterioration in the case of extended drive, when the light emitting diode is intended to emit a light of a short wavelength region (from yellow to yellow-green).

The following reasons are cited as the factors which decrease luminous efficiency, wherein such a decrease of the luminous efficiency tends to be caused according as the wavelength becomes shorter.
(i) Carrier confinement becomes insufficient since the energy-gap difference between an emission layer and a cladding layer becomes small.
(ii) A non-luminescence center in the emission layer increases since Al composition
(aluminium ratio) in an emission layer becomes large.
(iii) Energy band structure approaches to an indirect transition type structure from a direct transition type structure.

In order to solve the problems, in Japanese Patent No. 3373561 (hereinafter, it is described as Patent document 1), a method is disclosed wherein a non-emission level in an emission layer is decreased by decreasing Al composition in the emission layer so that the emission layer has a quantum well structure having ten to eighty layers. Furthermore, in Japanese Patent No. 3732626 (Hereinafter, it is described as Patent document 2), a method for increasing luminous efficiency is disclosed wherein Zn is doped in an emission layer so that a non-luminescence center caused by impurities such as Si and the like is inactivated.
Patent document 1: Japanese Patent No. 3373561
Patent document 2: Japanese Patent No. 3732626

DISCLOSURE OF INVENTION

Problems to be solved by the Invention

In the aforementioned Patent documents 1 and 2, methods are disclosed wherein the objects of preventing a decrease of luminous efficiency and a deterioration of a diode in the case of extended drive are achieved. However, the method disclosed in the Patent document 1 cannot suppress the overflow of a carrier sufficiently. When the method is used for a light-emitting diode which emits a light of a short wavelength, or is used at a high current, remarkable luminosity deterioration is observed.

In the method disclosed in Japanese patent document 2, when the amount of Zn included in the emission layer is too large, there is possibility that reliability may deteriorate by contraries, since luminous efficiency decreases as the result of the generation of a non-luminescence center due to Zn. However, Zn has the characteristic in general that Zn is easy to diffuse with heat, and control of the amount of Zn is difficult. Accordingly, it is important to control the amount of Zn adequately but the control of the amount of Zn is difficult, and therefore, there is a problem that it is difficult to maintain stable quality in the case of mass production.

The present invention is achieved in view of the aforementioned problems caused in the conventional art. The purpose of the present invention is to provide an AlGaInP light emitting diode wherein luminous efficiency in a short wavelength region is improved and deterioration of LED characteristics in the case of extended drive is prevented.

The present inventors have intensively studied, and found that by achieving the following things, it is possible to control overflow of a carrier, and as the result, it is possible to prevent a decrease of luminous efficiency and deterioration in the case of extended drive.
(i) Al composition of a barrier layer is made to 0.5 or more.
(ii) The number of a well layer is further increased.
(iii) The band gap of a p-type cladding layer and an n-type cladding layers is further increased.
(iv) An intermediate layer is provided between a p-type cladding layer and a quantum well layer.

Means for Solving a Subject

The present invention is provided to achieve the aforementioned objects, and structured by the following. That is, the present invention provides the following light emitting diode (1).

(1) A light emitting diode comprising: a laminate including
an n-type cladding layer,
an emission layer which has a quantum well structure having a well layer and a barrier layer,
an intermediate layer and
a p-type cladding layer in this order,
wherein the composition of each of the layers being represented by the composition formula: $(Al_XGa_{1-X})_YIn_{1-Y}P$ ($0 \leq X \leq 1$, $0 < Y \leq 1$), and the composition of the barrier layer being represented by the composition formula: $(Al_XGa_{1-X})_Y In_{1-Y}P$ ($0.5 \leq X \leq 1$, $0 < Y \leq 1$).

The light emitting diode of the present invention preferably has the following characteristics. These characteristics can be combined preferably.

(2) The composition of the barrier layer in the aforementioned light emitting diode according to (1) is $(Al_XGa_{1-X})_Y In_{1-Y}P$ ($0.6 \leq X \leq 0.8$, $0 < Y \leq 1$).

(3) The intermediate layer according to (1) and (2) has the composition of $(Al_XGa_{1-X})_YIn_{1-Y}P$ ($0.6 \leq X \leq 1$, $0 < Y \leq 1$).

(4) The Al composition (X) of the intermediate layer according to (1) to (3) is equal to or greater than the Al composition (X) of the barrier layer, but is smaller than the Al composition (X) of the cladding layers.

(5) The composition of the p-type cladding layer according to (1) to (4) is $Al_YIn_{1-Y}P$ ($0.4 \leq Y \leq 0.6$).

(6) The composition of the n-type cladding layer according to (1) to (5) is $Al_YIn_{1-Y}P$ ($0.4 \leq Y \leq 0.6$).

(7) The quantum well structure according to (1) to (6) is a multiple quantum well structure, and the number of the well layer is 81 to 200, preferably 100 to 200, and more preferably 150 to 200.

(8) The layer thickness of the well layer according to (1) to (7) is 2 to 10 nm, and the layer thickness of the barrier layer according to (1) to (7) is 2 to 10 nm.

(9) The layer thickness of the well layer according to (1) to (8) is 3 to 6 nm, and the layer thickness of the barrier layer according to (1) to (8) is 3 to 6 nm.

(10) The emission wavelength of the light emitting diode according to (1) to (9) is 550 to 620 nm, preferably 550 to 600 nm, and more preferably 550 to 580 nm.

(11) The laminate structure according to (1) to (10) is a structure grown on a GaAs substrate, which is oriented by 10 to 20 degrees toward <011> direction or <01-1> direction from (100) plane.

(12) The quantum well structure according to (1) to (10) is grown under undoped conditions, and the quantum well structure exists between a p-type cladding layer doped with Mg and an n-type cladding layer doped with Si.

Effect of Invention

The present invention can provide an AlGaInP based compound semiconductor light emitting diode which is excellent in reliability and has high-luminance as compared with the conventional diode, and which can improve deterioration in the case of extended drive. In particular, the present invention can provide an AlGaInP light emitting diode which has the luminescence wavelength of 550 to 620 nm.

BRIEF DESCRIPTION OF THE REFERENCE SYMBOLS

Figure 1:
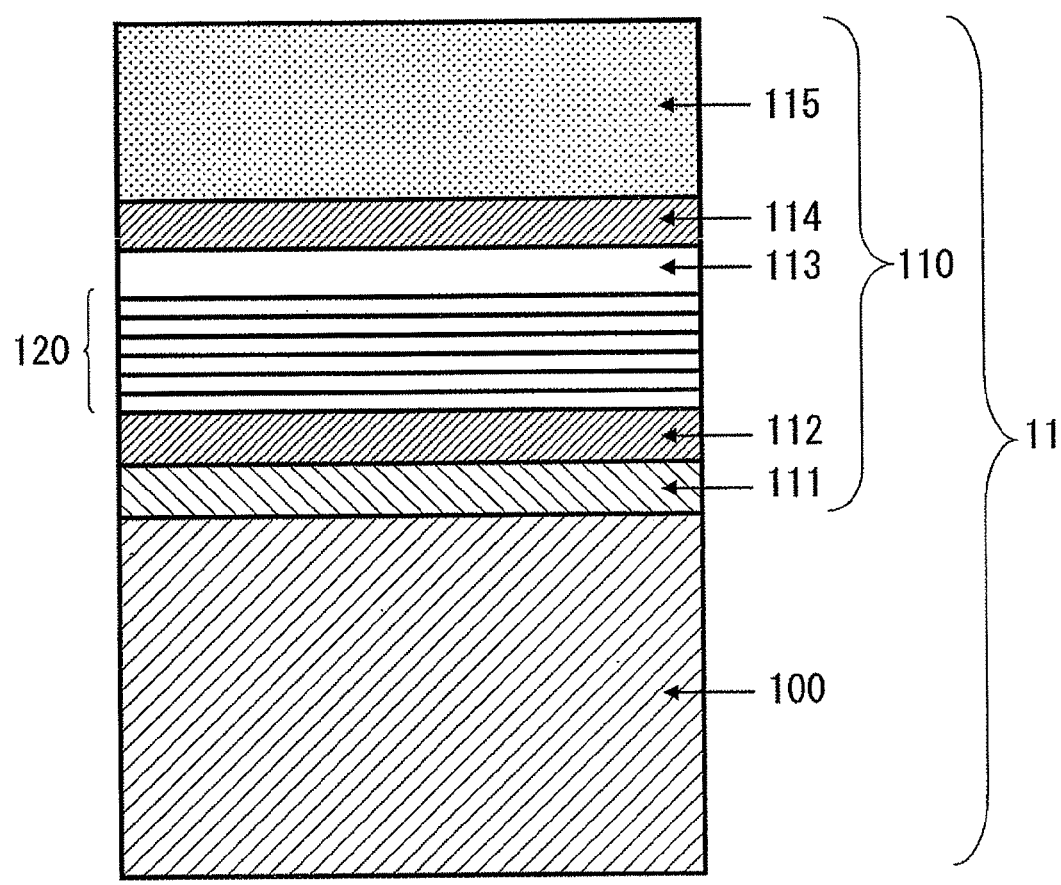
FIG. 1 shows a schematic cross-sectional view of an epitaxial wafer which shows one example of the present invention.

100: an n-type GaAs substrate
11 an epitaxial wafer
110: an epitaxial layer
111: an n-type buffer layer
112: an n-type cladding layer
113: an intermediate layer
114: a p-type cladding layer
115: a p-type GaP layer
120: a quantum well structure
121: a well layer
122: a barrier layer
13: an absorption substrate type light emitting diode
14: a n-type ohmic electrode
15: a p-type ohmic electrode
16: a transparent substrate type light emitting diode
17: a transparent substrate

BEST MODE FOR CARRYING OUT THE INVENTION

Hereinafter, preferable examples of the present invention are explained. However, the present invention is not limited only to the following each examples, and for example, it is possible to combine structural elements of the examples suitably.

The present invention provides a light emitting diode characterized in that the diode comprises an n-type cladding layer, an emission layer which is structured by a quantum well structure and a p-type cladding layer, and furthermore comprises an intermediated layer between the emission layer and the p-type cladding layer; and the aforementioned layers have the composition represented by the composition formula: $(Al_XGa_{1-X})_YIn_{1-Y}P$ ($0 \leq X \leq 1$, $0 \leq Y \leq 1$), and particularly the barrier layer of the quantum well structure has the composition represented by the composition formula: $(Al_XGa_{1-X})_YIn_{1-Y}P$ ($0.5 < X \leq 1$).

Hereinafter, embodiments of the present invention will be explained with reference to the attached figures.

Figure 2:
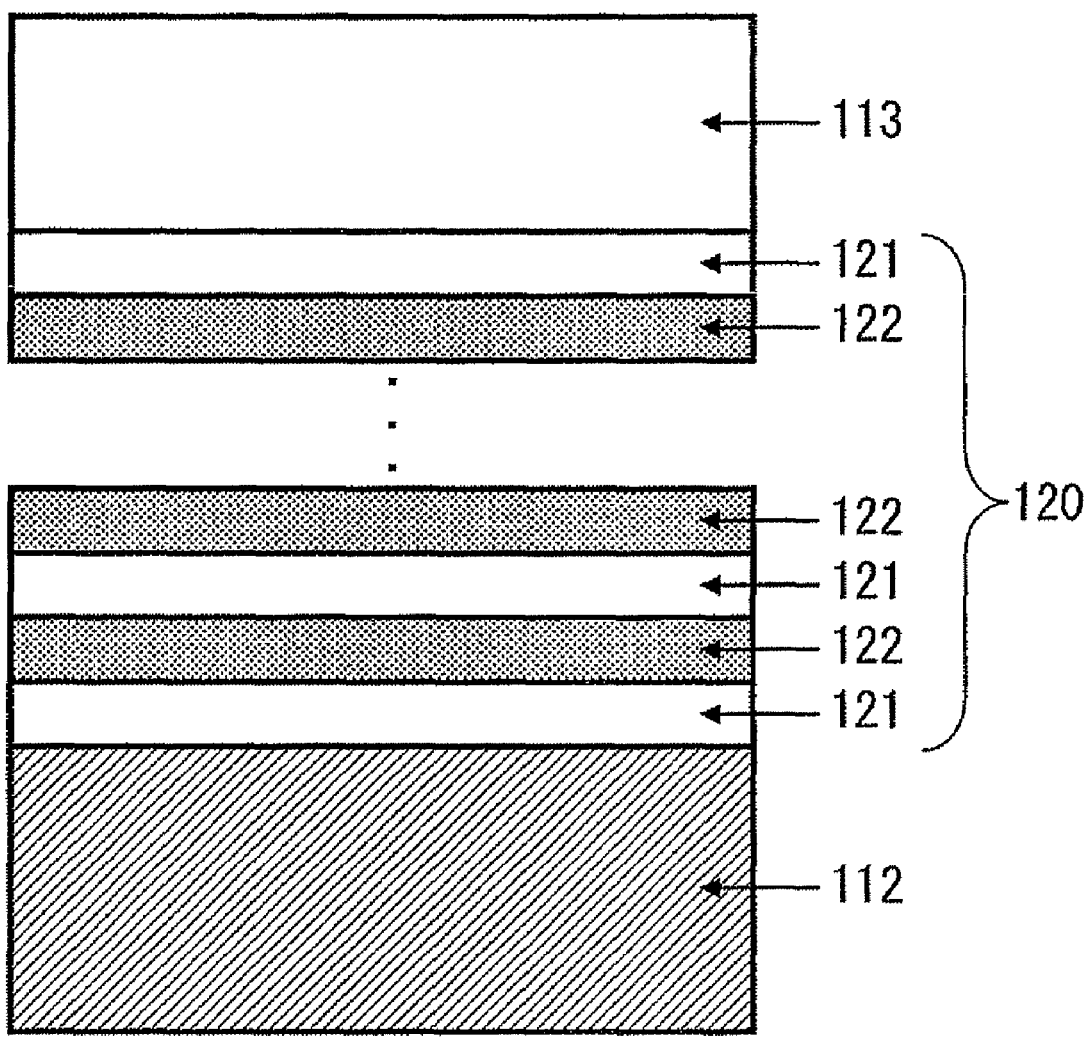
FIG. 2 shows a schematic enlarged view which shows the fine structure of the quantum well structure of FIG. 1.

FIG. 1 is a schematic view showing the cross-sectional structure of a light emitting diode which is one example of the present invention. On the substrate, epitaxial layers of an AlGaInP based compound semiconductor is laminated. FIG. 2 is a schematic enlarged view which shows the quantum well structure of FIG. 1 in detail.

As shown in the figures, the light emitting diode of FIG. 1 has, on an n-type GaAs substrate 100, an n-type GaAs buffer layer 111, an n-type $(Al_XGa_{1-X})_YIn_{1-Y}P$ ($0.7 \leq X \leq 1$) cladding layer 112, a AlGaInP based quantum well structure 120, a $(Al_XGa_{1-X})_YIn_{1-Y}P$ ($0.6 \leq X \leq 1$) intermediate layer 113, a p-type $(Al_XGa_{1-X})_YIn_{1-Y}P$ ($0.7 \leq X \leq 1$) cladding layer 114 and a p-type GaP current diffusion layer 115 in this order.

Although the Al composition of the barrier layer 122 contained in the quantum well structure can be selected if necessary, it is preferable that the ratio is in the range of $0.5 < X \leq 1$. Al composition (X) represents the ratio of Al atoms based on the total sum of the number of Al atoms and the number of Ga atoms in a layer, and Al composition (X) can be represented by the following formula.

X=Al/(Al+Ga)

When the Al composition of a barrier layer is too small, luminous efficiency decreases since overflow of a carrier is caused. Accordingly, a bigger Al composition makes it possible to increase luminous efficiency. However, when Al composition nears 1, reliability deteriorates. Accordingly, in the present invention, Al composition of a barrier layer is preferably 0.5 to 0.95, and more preferably 0.6 to 0.8.

The thickness of the well layer 121 of the quantum well structure can be selected if necessary. It is preferable that the thickness is in the range of 2 to 10 nm. When the thickness thereof is thin, the emission wavelength becomes short due the confinement effect, and therefore, it is possible to decrease the Al composition in an emission layer and to decrease the non-emission level. However, when the thickness thereof is too thin, the distribution of the layer thickness has a great influence on the distribution of the emission wavelength, and such a diode is not suitable for massproduction. Therefore, the thickness of a well layer is preferably 2 to 8 nm, and more preferably 3 to 6 nm.

The thickness of the barrier layer 122 of the quantum well structure can be selected if necessary. It is preferable that the thickness thereof is 2 to 10 nm. When the thickness thereof is thin, the confinement effect is decreased due to the tunnel effect. However, when the thickness thereof is too thick, there is a problem that the forward drive voltage increases. Furthermore, when the thickness thereof is unnecessarily increased, the raw material cost increases and productivity of diodes deteriorates. Accordingly, the thickness of a barrier layer is preferably 2 to 8 nm, and more preferably 3 to 6 nm.

In the present invention, the upper-most layer and the lower-most layer of the quantum well structure are preferably well layers. When the diode has such a structure, unnecessary increase of the forward drive voltage can be prevented.

The intermediate later which can be provided between an emission layer and a p-type cladding layer desirably has the composition of $(Al_xGa_{1-x})_yIn_{1-y}P$ ($0.6 \leq X \leq 1$, $0 < Y \leq 1$). In order to prevent increase of the forward drive voltage caused by the band gap difference, it is desirable that the Al composition of the intermediate layer is greater than or equal to the Al composition of the barrier layer but is no more than the Al composition of the cladding layer. Furthermore, although the thickness of an intermediate layer can be selected as necessary, the thickness is preferably 200 to 1000 nm, and more preferably 300 to 700 mm.

Although the composition of a p-type cladding layer can be selected if necessary, the layer has preferably the composition of $(Al_xGa_{1-x})_yIn_{1-y}P$ ($0.7 \leq X \leq 1$, $0 < Y \leq 1$). In order to control overflow of a carrier and to increase luminous efficiency, the layer more preferably has the composition of $Al_yIn_{1-y}P$ ($0.4 \leq X \leq 0.6$). Although the thickness of a p-type cladding layer can be selected as necessary, the thickness is preferably 300 to 1200 nm, and more preferably 500 to 900 nm.

Although the composition of an n-type cladding layer can be selected if necessary, the layer preferably has the composition of $(Al_xGa_{1-x})_yIn_{1-y}P$ ($0.7 \leq X \leq 1$, $0 < Y \leq 1$). In order to control overflow of a carrier and to increase luminous efficiency, the layer more preferably has the composition of $Al_yIn_{1-y}P$ ($0.4 \leq X \leq 0.6$). It is possible to provide an additional intermediate layer of $((Al_xGa_{1-x})_yIn_{1-y}P$ ($0.6 \leq X \leq 1$, $0 < Y \leq 1$) between an n-type cladding layer and an emission layer. Although the thickness of an n-type cladding layer can be selected as necessary, the thickness is preferably 200 to 1000 nm, and more preferably 300 to 700 nm.

In the present invention, n-type dopant can be selected if necessary. For example, it is possible to use Si, Te and Se as the dopant. Si is preferably used since it is hard for Si to remain in a reactor, and is excellent in abruptness. Furthermore, in the present invention, p-type dopant can be selected if necessary. For example, it is possible to use Mg, Zn and Be as the dopant. Mg is preferably used since diffusion by heat of Mg is small, and Mg does not have problems regarding toxicity.

In order to increase light extraction efficiency, a DBR (Distributed Bragg Reflector) layer may be provided between the buffer layer 111 and the lower cladding layer 112. The DBR layer may be structured such that the layer is an AlGaAs type, an AlGaInP type or the combination of the two types.

Figure 3:
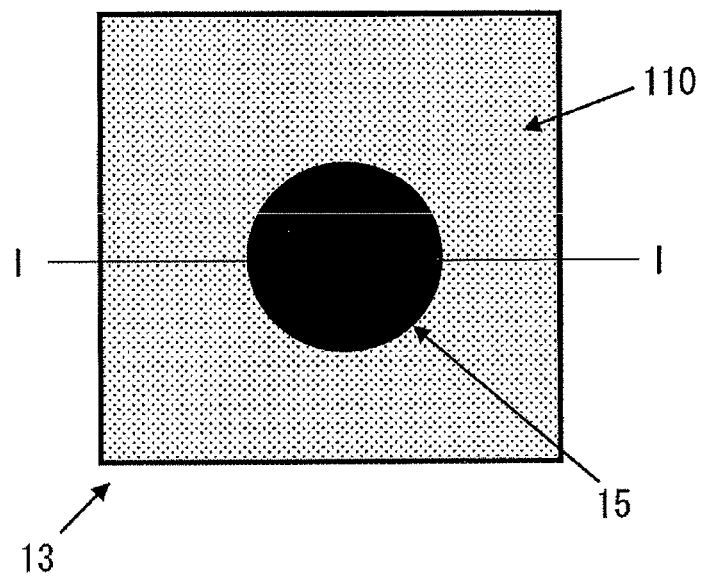
FIG. 3 shows a schematic plane view of a semiconductor light emitting diode of Example 1 of the present invention.
Figure 4:
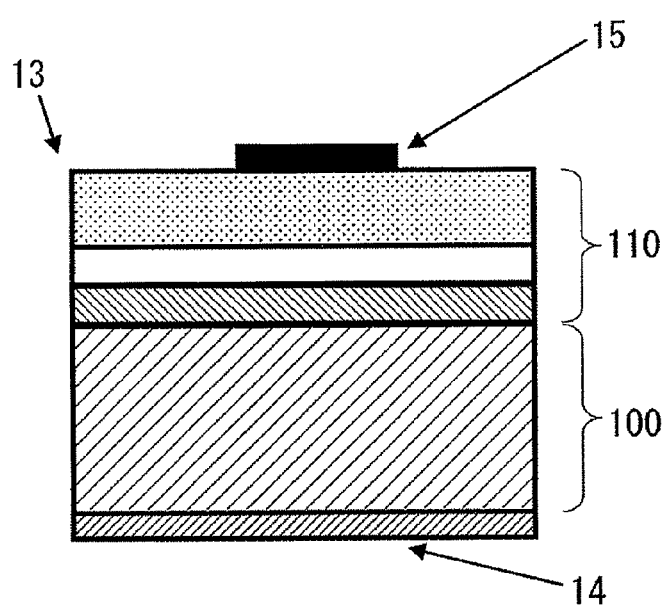
FIG. 4 shows a schematic cross-sectional view in which a cross-section at the position of I-I line of the semiconductor light emitting diode of FIG. 3 is shown.

In the present invention, it is possible to generate a low price type and an absorber substrate type light-emitting diode 13 as shown in FIG. 3 (plan view) and FIG. 4 (sectional view), wherein an n electrode 14 is provided to the GaAs substrate side of the epitaxial wafer of FIG. 1, and a p electrode 15 is provided to the p-type GaP layer side thereof, if necessary. The reason why the GaAs substrate is called an "absorber substrate type" is that the GaAs substrate adsorbs light emitted from the emission layer.

Figure 5:
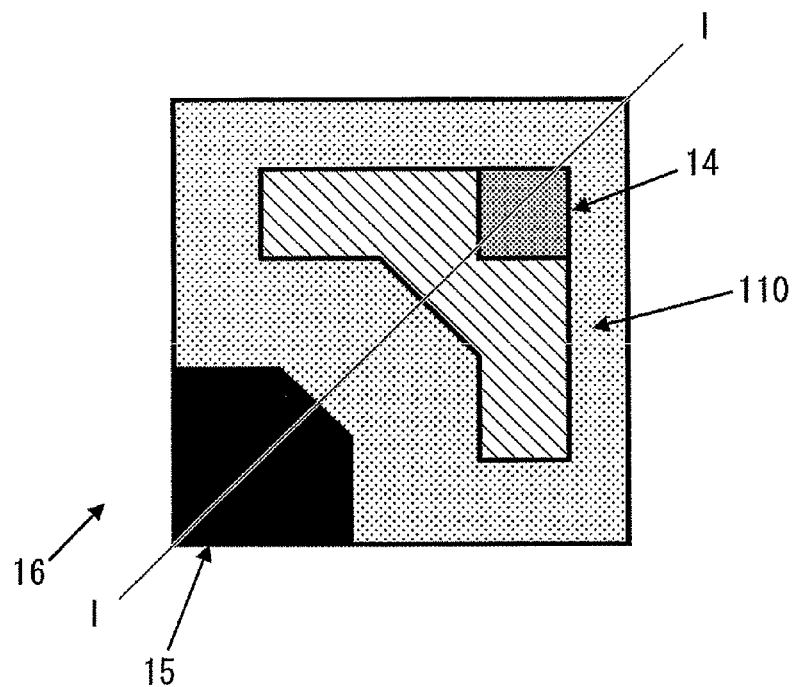
FIG. 5 shows a schematic plane view of a semiconductor light emitting diode of Example 4 of the present invention.
Figure 6:
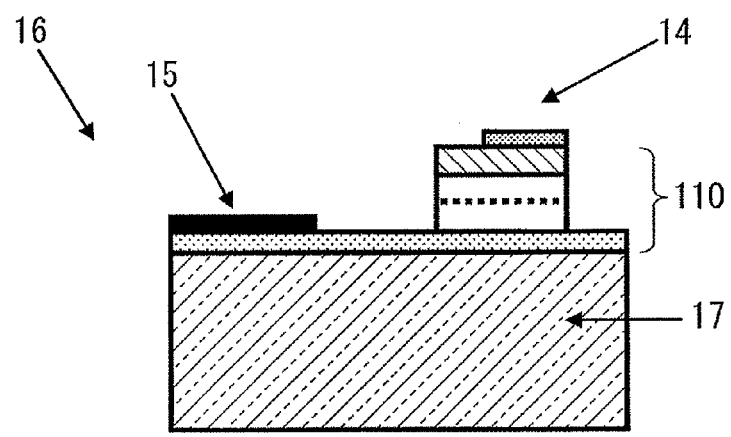
FIG. 6 shows a schematic cross-sectional view in which a cross-section at the position of I-I line of the semiconductor light emitting diode of FIG. 5 is shown.

Furthermore, in the present invention, as shown in FIG. 5 (plan view) and FIG. 6 (sectional view), it is possible to generate a so-called transparent substrate type light-emitting diode, wherein a substrate, which is transparent with respect to radiated light, is bonded to the p-type GaP layer side, and an n electrode and a p electrode are provided subsequent to removing an opaque GaAs substrate.

It is also possible to generate a reflection substrate type high luminance light-emitting diode 16 wherein a substrate, which reflects radiated light, is bonded to the p-type GaP layer side, and an n electrode and a p electrode are provided subsequent to removing an opaque GaAs substrate.

In the present invention, a substrate can be selected if necessary. Concrete examples of the substrate include GaAs, Si, Ge and the like. A GaAs substrate is preferably used which has an orientation of 10 to 20 degrees, which is oriented from (100) plane to <011> direction or <01-1> direction.

EXAMPLES

Hereinafter, Examples of the present invention are explained. However, the present invention is not limited merely by the Examples.

Example 1

As Example 1, an absorber substrate type light-emitting diode 13, which emitted a light having the wavelength of near 570 nm and had the structure shown in FIGS. 3 and 4, was generated. As shown in FIG. 1, this light emitting element was generated such that, on a semiconductor substrate 100 consisting of a GaAs single crystal wherein the crystal was of n-type and doped with Si and had an orientation of 15 degrees from (100) plane to <01-1> direction, following layers were provided according to the following order using the MOCVD method (the Metal Organic Chemical Vapor Deposition method). An epitaxial wafer 11 was generated wherein the following layers were grown in the following order on the substrate.

An n-type GaAs buffer layer 111 (thickness 500 nm, Si doped: $1 \times 10^{18}$ cm$^{-3}$)

An n-type $Al_{0.5}In_{0.5}P$ cladding layer 112 (thickness 500 nm, Si doped: $2 \times 10^{18}$ cm$^{-3}$)

An $(Al_{0.3}Ga_{0.7})_{0.5}In_{0.5}P$ well layer 121 (thickness 4 nm, undoped)

An $(Al_{0.7}Ga_{0.3})_{0.5}In_{0.5}P$ barrier layer 122 (thickness 500 nm, undoped)

An $(Al_{0.7}Ga_{0.3})_{0.5}In_{0.5}P$ intermediate layer 113 (thickness 500 nm, undoped)

A p-type $Al_{0.5}In_{0.5}P$ cladding layer 114 (thickness 700 nm, Mg doped: $1 \times 10^{18}$ cm$^{-3}$)

A p-type GaP current diffusion layer 115 (thickness 10 μm, Mg doped: $5 \times 10^{18}$ cm$^{-3}$)

Here, merely the GaP layer was grown at 740° C., and the other layers were formed at the temperature of 670° C. The well layer 121 was generated such that the number of a well layer included therein was 150, and the barrier layer was generated such that the number of a barrier layer included therein was 149.

Furthermore, an n electrode 14 was provided to the GaAs substrate side of the epitaxial wafer, and a p electrode 15 was provided to the p-type GaP layer side thereof, and dicing was conducted to form a light emitting diode 10 of a 300 μm square piece. The formed light emitting diode was mounted to a TO-18 stem, wire-bonding was performed, and the characteristics of the light emitting diode were evaluated.

Thus, the luminance of the formed light emitting diode was 29 mcd, and the value was about 2.2 times that of the conventional structure wherein the number of the well layer was 50. The measurement of luminance was conducted with an integrating sphere manufactured by Teknologue Company.

Example 2

Figure 7:
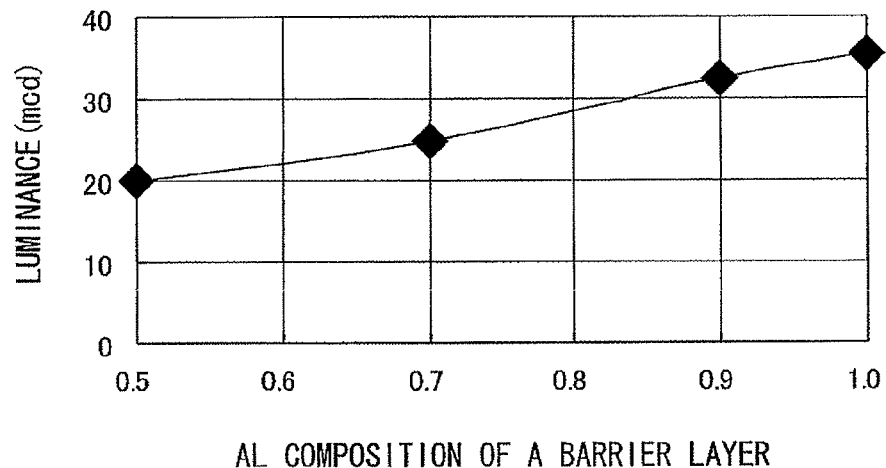
FIG. 7 shows a view which represents the relationship between Al composition of a barrier layer and the luminance of a light emitting element regarding the semiconductor light emitting diode of Example 2 of the present invention.
Figure 8:
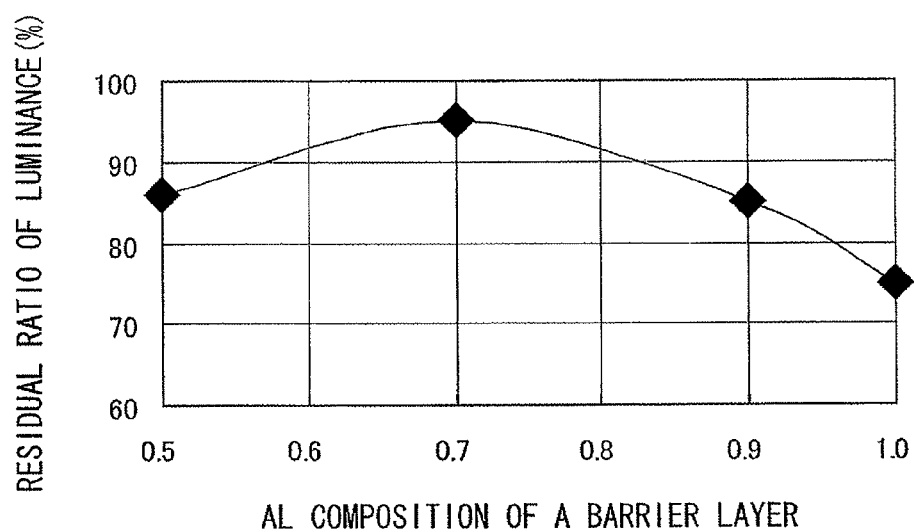
FIG. 8 shows a view which represents the relationship between Al composition of a barrier layer and the residual ratio of luminance of a light emitting element regarding the semiconductor light emitting diode of Example 2 of the present invention.

In Example 2, epitaxial wafers were produced in according to the same conditions of Example 1 except that the Al ratio of the barrier layer of the quantum well structure was changed. After electrodes were provided on the wafers, the characteristics thereof were evaluated. Regarding the generated light emitting diodes, the relationship between the Al composition of the barrier layer and the luminance or the residual ratio of luminance thereof are shown in FIGS. 7 and 8. FIG. 7 represents the relationship between the Al composition of the barrier layer and the luminance thereof, and FIG. 8 represents the relationship between the Al composition of the barrier layer and the residual ratio of luminance thereof. Here, the residual ratio of luminance was determined such that five points were elected from a plane of the wafer, and the average of luminance of the points after electrifying were divided by the average of luminance of the points before electrifying.

Although the luminance increases as Al composition increases, the maximum residual ratio of luminance was obtained when Al composition was near 0.7.

TABLE 1

Al composition of a barrier layer and the characteristics of a light emitting diode

| Al Composition | Luminance (mcd) | Residual ratio of luminance (%) |
|---|---|---|
| 0.5 | 20.1 | 86 |
| 0.7 | 24.7 | 95 |
| 0.9 | 32.3 | 85 |
| 1.0 | 35.6 | 75 |

(The number of a well layer = 100)

Example 3

In Example 3, an epitaxial wafer was produced according to the same conditions of Example 1 except that the number of a well layer in a quantum well structure was changed. Then, electrodes were provided thereto, and the characteristics were evaluated.

Figure 9:
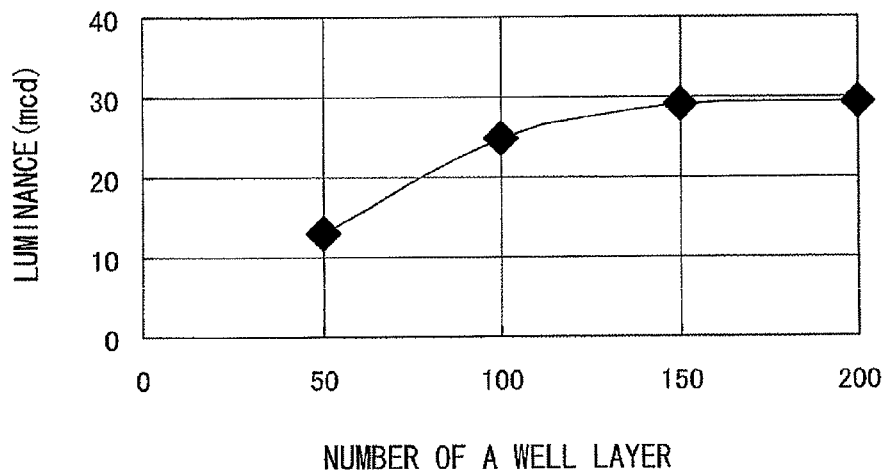
FIG. 9 shows a view which represents the relationship between the number of a quantum well layer and the luminance regarding the semiconductor light emitting diode of Example 2 of the present invention.
Figure 10:
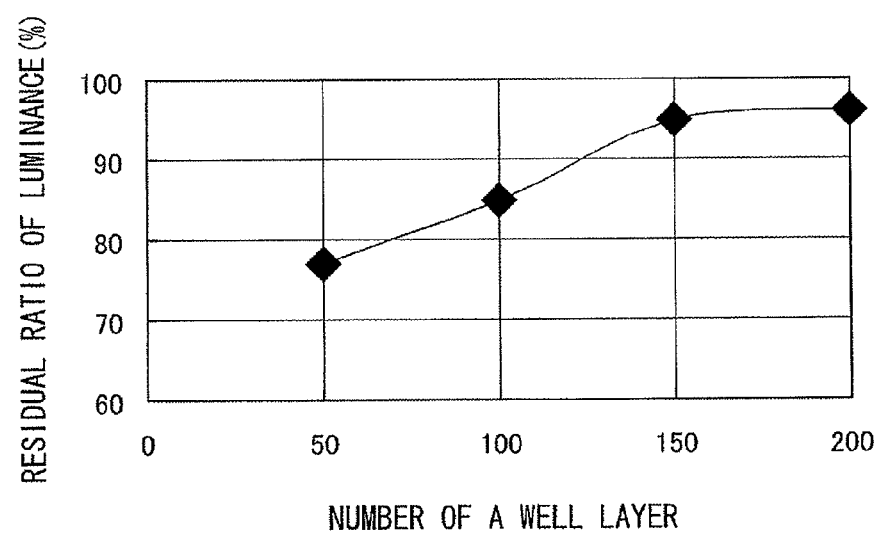
FIG. 10 shows a view which represents the relationship between the number of a quantum well layer and the residual ratio of luminance regarding the semiconductor light emitting diode of Example 1 of the present invention.

Regarding the generated light emitting diode, the relationship between luminance and the number of well layers, and the relationship between the residual ratio of luminance and the number of well layers, are shown in Table 2, FIGS. 9 and 10. FIG. 9 shows the relationship between the number of well layers and the luminance, and FIG. 10 shows the relationship between the number of a well layer and the residual ratio of luminance. Although both the luminance and the residual ratio of luminance show better results as the number of the well layers increases, the values flattened when the number of the well layers was about 150 layers.

TABLE 2

The number of a well layer and the characteristics of a light emitting diode

| The number of a well layer | Luminance (mcd) | Residual ratio of luminance (%) |
|---|---|---|
| 50 | 13.1 | 77 |
| 100 | 24.7 | 85 |
| 150 | 29.1 | 95 |
| 200 | 29.4 | 96 |

(Al composition of a barrier layer = 0.7)

Example 4

In Example 4, a transparent substrate type light emitting diode 16, which emitted a light having the wavelength of near 570 nm and had the structure shown in FIGS. 5 and 6, was generated as described below. Similar to Example 1, following layers were provided according to the following order on a semiconductor substrate 100 which consists of a GaAs single crystal, wherein the crystal was of n-type and doped with Si, and had an orientation of 15 degrees from (100) plane to <100> direction, by the MOCVD method. As the result, an epitaxial wafer 11 was generated wherein the following layers were grown in the following order on the substrate.

An n-type GaAs buffer layer 111 (thickness 500 nm, Si doped: $1 \times 10^{18}$ cm$^{-3}$)

An n-type $Al_{0.5}In_{0.5}P$ cladding layer 112 (thickness 500 nm, Si doped: $2 \times 10^{18}$ cm$^{-3}$)

A $(Al_{0.2}Ga_{0.8})_{0.5}In_{0.5}P$ well layer 121 (thickness 4 nm, undoped)

A $(Al_{0.7}Ga_{0.3})_{0.5}In_{0.5}P$ barrier layer 122 (thickness 5 nm, undoped)

A $(Al_{0.7}Ga_{0.3})_{0.5}In_{0.5}P$ intermediate layer 113 (thickness 500 nm, undoped)

A p type $Al_{0.5}In_{0.5}P$ cladding layer 114 (thickness 700 nm, Mg doped: $1 \times 10^{18}$ cm$^{-3}$)

A p-type GaP current diffusion layer 115 (thickness 10 μm, Mg doped: $6 \times 10^{18}$ cm$^{-3}$)

Here, merely the GaP layer was grown at 740° C., and the other layers were formed at the temperature of 670° C. The well layer 121 was generated such that the number of a well layer was 150, and the barrier layer was generated such that the number of a barrier layer was 149.

GaP was bonded to the surface of the produced epitaxial wafer 11 by the activated bonding method so that the semiconductor layer was able to be mechanically supported. Then, wet etching was conducted to remove the GaAs substrate from the wafer. By conducting such a method, the extraction efficiency to the exterior of a light emitting element can be improved, and the compound semiconductor LED having high-luminance can be structured.

Furthermore, an n-type electrode 14 was provided on a surface from which the GaAs substrate had been removed, and the predetermined position of the epitaxial layers was removed to provide a p-type electrode 15. Subsequently, dicing was conducted to form a light emitting diode of a 300 μm square piece. The formed light emitting diode was mounted to a TO-18 stem, wire-bonding was performed, and the characteristics of the light emitting diode were evaluated.

The luminance of the formed light emitting diode was 105 mcd, and the value was about 2.0 times that of the conventional structure.

INDUSTRIAL APPLICABILITY

It is possible to provide an AlGaInP light emitting diode which can improve the deterioration of LED characteristics in the case of extended use, and to improve luminous efficiency of AlGaInP semiconductor light emitting diode at the short wavelength region. The light emitting diode of the present invention can emit light in a wide wavelength region from red to yellowish green with high-luminance, and since deterioration of the diode in the case of extended use is small, the light emitting diode of the present invention can be used for a white diode by combining various kinds of lamps or various light emitting diodes such as a blue or the like.

The invention claimed is:

1. A light emitting diode comprising: a laminate including
   an n-type cladding layer,
   an emission layer which has a quantum well structure having a well layer and a barrier layer,
   an intermediate layer and
   a p-type cladding layer in this order;
   wherein the composition of each of the layers is represented by the composition formula: $(Al_XGa_{1-X})_YIn_{1-Y}P$ ($0 \leq X \leq 1$, $0 < Y \leq 1$),
   the composition of the barrier layer is represented by the composition formula:
   $(Al_XGa_{1-X})_YIn_{1-Y}P$ ($0.5 \leq X \leq 1$, $0 < Y \leq 1$),
   the intermediate layer is an undoped layer and has the composition of $(Al_XGa_{1-X})_YIn_{1-Y}P$ ($0.6 \leq X \leq 1$, $0 < Y \leq 1$), and
   the Al composition (X) of the intermediate layer is equal to or greater than the Al composition (X) of the barrier layer, but is smaller than the Al composition (X) of the cladding layers.

2. The light emitting diode according to claim 1, wherein the composition of the barrier layer in the light emitting diode is $(Al_XGa_{1-X})_YIn_{1-Y}P$ ($0.6 \leq X \leq 0.8$, $0 < Y \leq 1$).

3. The light emitting diode according to claim 1, wherein the composition of the p-type cladding layer is $Al_YIn_{1-Y}P$ ($0.4 \leq Y \leq 0.6$).

4. The light emitting diode according to claim 1, wherein the composition of the n-type cladding layer is $Al_YIn_{1-Y}P$ ($0.4 \leq Y \leq 0.6$).

5. The light emitting diode according to claim 1, wherein the quantum well structure is a multiple quantum well structure, and the number of the well layer is 81 to 200.

6. The light emitting diode according to claim 1, wherein the layer thickness of the well layer is 2 to 10 nm, and the layer thickness of the barrier layer is 2 to 10 nm.

7. The light emitting diode according to claim 1, wherein the layer thickness of the well layer is 3 to 6 nm, and the layer thickness of the barrier layer is 3 to 6 nm.

8. The light emitting diode according to claim 1, wherein the emission wavelength of the light emitting diode is 550 to 620 nm.

9. The light emitting diode according to claim 1, wherein the laminate structure is a structure grown on a GaAs substrate, which is oriented by 10 to 20 degrees toward <011> direction or <01-1> direction from (100) plane.

10. The light emitting diode according to claim 1, wherein the quantum well structure has been grown under the undoped conditions, and the quantum well structure exists between a p-type cladding layer doped with Mg and an n-type cladding layer doped with Si.

11. A light emitting diode comprising: a laminate including
    an n-type cladding layer,
    an emission layer which has a quantum well structure having a well layer and a barrier layer,
    an intermediate layer and
    a p-type cladding layer in this order;
    wherein the composition of each of the layers is represented by the composition formula: $(Al_XGa_{1-X})_YIn_{1-Y}P$ ($0 \leq X \leq 1$, $0 < Y \leq 1$),
    the composition of the barrier layer is represented by the composition formula:
    $(Al_XGa_{1-X})_YIn_{1-Y}P$ ($0.5 \leq X \leq 1$, $0 < Y \leq 1$),
    the intermediate layer has the composition of $(Al_XGa_{1-X})_YIn_{1-Y}P$ ($0.6 \leq X \leq 1$, $0 < Y \leq 1$), and
    the Al composition (X) of the intermediate layer is equal to or greater than the Al composition (X) of the barrier layer, but is smaller than the Al composition (X) of the cladding layers, and
    the number of the well layer in the quantum well structure is 100 to 200.

12. The light emitting diode according to claim 11, wherein the number of the well layer in the quantum well structure is 150 to 200.

13. The light emitting diode according to claim 11, wherein the composition of the barrier layer in the light emitting diode is $(Al_XGa_{1-X})_YIn_{1-Y}P$ ($0.6 \leq X \leq 0.8$, $0 < Y \leq 1$).

14. The light emitting diode according to claim 11, wherein the composition of the p-type cladding layer is $Al_YIn_{1-Y}P$ ($0.4 \leq Y \leq 0.6$).

15. The light emitting diode according to claim 11, wherein the composition of the n-type cladding layer is $Al_YIn_{1-Y}P$ ($0.4 \leq Y \leq 0.6$).

16. The light emitting diode according to claim 11, wherein the layer thickness of the well layer is 2 to 10 nm, and the layer thickness of the barrier layer is 2 to 10 nm.

17. The light emitting diode according to claim 11, wherein the layer thickness of the well layer is 3 to 6 nm, and the layer thickness of the barrier layer is 3 to 6 nm.

18. The light emitting diode according to claim 11, wherein the emission wavelength of the light emitting diode is 550 to 620 nm.

19. The light emitting diode according to claim 11, wherein the laminate structure is a structure grown on a GaAs substrate, which is oriented by 10 to 20 degrees toward <011> direction or <01-1> direction from (100) plane.

20. The light emitting diode according to claim 11, wherein the quantum well structure has been grown under the undoped conditions, and the quantum well structure exists between a p-type cladding layer doped with Mg and an n-type cladding layer doped with Si.

* * * * *